(12) United States Patent
Chen

(10) Patent No.: US 7,173,231 B2
(45) Date of Patent: Feb. 6, 2007

(54) CHIP SCALE PACKAGE STRUCTURE FOR AN IMAGE SENSOR

(76) Inventor: Wen Ching Chen, P.O. Box 2103, Taichung (TW)

(*) Notice: Subject to any disclaimer, the term of this patent is extended or adjusted under 35 U.S.C. 154(b) by 239 days.

(21) Appl. No.: 10/662,433

(22) Filed: Sep. 16, 2003

(65) Prior Publication Data

US 2005/0056769 A1    Mar. 17, 2005

(51) Int. Cl.
H01L 31/00 (2006.01)
H01L 27/00 (2006.01)
H01L 31/0203 (2006.01)

(52) U.S. Cl. .............. 250/214.1; 250/208.1; 257/433

(58) Field of Classification Search ........ 257/434, 257/433, 678, 680, 729, 730, 687, 679, 700, 257/701, 702, 703, 704, 705, 733; 250/208.1, 250/214.1, 239
See application file for complete search history.

(56) References Cited

U.S. PATENT DOCUMENTS

| | | | | |
|---|---|---|---|---|
| 6,211,461 | B1 * | 4/2001 | Park et al. | 174/52.4 |
| 6,342,406 | B1 * | 1/2002 | Glenn et al. | 438/57 |
| 6,476,503 | B1 * | 11/2002 | Imamura et al. | 257/780 |
| 6,580,169 | B2 * | 6/2003 | Sakuyama et al. | 257/738 |
| 6,731,010 | B2 * | 5/2004 | Horiuchi et al. | 257/777 |

* cited by examiner

Primary Examiner—Georgia Epps
Assistant Examiner—Don Williams
(74) Attorney, Agent, or Firm—Rosenberg, Klein & Lee

(57) ABSTRACT

A chip scale package (CSP) structure for an image sensor includes a semi-conductor image sense chip and multiple bonding pads formed on a top face of the semi-conductor image sense chip. A conducting wire extends from each of the multiple bonding pads by wire-bonding. Liquefied jelly-like material is covered with the top face of the semi-conductor image sense chip and forming a transparent layer on the top face of the semi-conductor image sense chip after drying up. The transparent layer has a thickness being equal to a height of each of the conduct wire relative to the top face of the semi-conductor image sense chip.

8 Claims, 5 Drawing Sheets

CHIP SCALE PACKAGE STRUCTURE FOR AN IMAGE SENSOR

BACKGROUND OF THE INVENTION

1. Field of the Invention

The present invention relates to a chip scale package structure, and more particularly to a chip scale package structure for an image sensor.

2. Description of Related Art

The current package technology of an image sensor usually use the ceramic leaded chip carrier (CLCC) or plastic leaded chip carrier (PLCC) that needs the processes of embedding a die pad and wire bonding. However, the number of I/O pins of an electric element become great, the thickness of the electric element becomes thin and the volume of the electric element becomes small under the requests of a slight weight, multi-function and a quick process speed. Consequently, the conventional solder technology is limited due to the diameter of the holes in the PCB for receiving the leads of electric parts. The surface mounting technology (SMT) is provided to overcome the problem of the conventional solder technology. However, the PCB cannot be used to load the current thin lead such that the leads of electric parts are arranged in an array type for enhancing the yield of manufacturing. However, a hollow solder and a curve PCB is occurred after soldering according to great number I/O leads and a small package volume. To solve the above problem is to lessen the volume of the jelly on the chip as small as possible.

As described above, the chip package technology trends toward Flip chip package. The process of flip chip package needs to grow multiple bumps on the wafer and each bump is electrically connected to the circuit on a PCB such that the top of each of the bumps face the PCB and the prerequisite condition of a open sensing area of the image sensor is limited. Consequently, the flip chip has a good electric property, heat dissipation and a small packaged size, but it is difficult to use the technology of flip chip on an image sensor very well.

A conventional flip chip package structure of an image sensor in accordance with the prior art shown in FIG. 7 comprises a glass plate (91) including an inner face forming a circuit (910) on the inner face of the glass plate (91) by etching. A chip (92) is soldered on the circuit near a middle portion of the glass plate (91) by using first tin balls (93) and the technology of flip chip. The circuit (910) of the glass plate (91) has two opposite sides each having a second tin ball (94) for surface mounting of the circuit (910). The diameter of each of the second tin ball (94) must be greater than the thickness of the chip (92) for a good reliability. For a suitable interval between the two second tin balls (94) the area of the glass plate (91) must be enlarged. Consequently, the enlarged glass plate (91) enlarges the volume of the image sensor. The type of the conventional flip chip package structure needs to be advantageously altered.

The present invention has arisen to mitigate and/or obviate the disadvantages of the conventional flip chip package structure.

SUMMARY OF THE INVENTION

The main objective of the present invention is to provide an improved chip scale package (CSP) structure for an image sensor.

To achieve the objective, the CSP structure in accordance with the present invention comprises a semi-conductor image sense chip and multiple bonding pads formed on a top face of the semi-conductor image sense chip. A conducting wire extends from each of the multiple bonding pads by wire-bonding. Liquefied jelly-like material is covered with the top face of the semi-conductor image sense chip and forming a transparent layer on the top face of the semi-conductor image sense chip after drying up. The transparent layer has a thickness being equal to a height of each of the conduct wire relative to the top face of the semi-conductor image sense chip.

Further benefits and advantages of the present invention will become apparent after a careful reading of the detailed description with appropriate reference to the accompanying drawings.

DETAILED DESCRIPTION OF THE INVENTION

Figure 1:
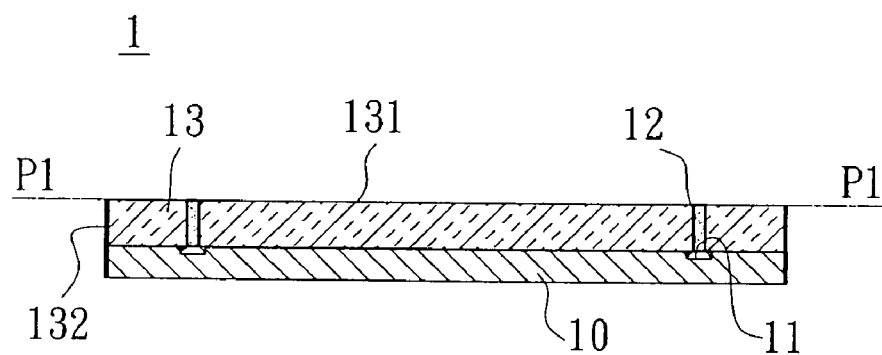
FIG. 1 is a cross-sectional view of a chip scale package structure for an image sensor in accordance with the present invention.

Referring to the drawings and initially to FIG. 1, a chip scale package (CSP) structure (1) for an image sensor in accordance with the present invention comprises semi-conductor image sense chip (10) having multiple bonding pads (11) disposed in a top face of the semi-conductor image sense chip (10). A conduct wire (12) extends from each of the bonding pads (11) by a wire-bonding machine.

The top face of the semi-conductor image sense chip (10) is coated by liquefied jelly-like material that forms a transparent layer (13) after drying up. The transparent layer (13) has a top face (131) that is ground and burnished to form a plane (P1) that is parallel to the top face of the semi-conductor image sense chip (10). The transparent layer (13) has a thickness being equal to a height of each of the conduct wires (12) relative to the top face of the semi-conductor image sense chip (10). The transparent layer (13) has a periphery covered by a shelter (132) to prevent the light from laterally penetrating into the chip scale package structure and influencing the quality of the images that is collected by the chip scale package structure.

According to the SCP structure (1) of the present invention, the manufacturing processes of chip scale package are simplified. The manufacturer can bond the conduct wire (12) and form the transparent layer (13) before dividing the wafer. The wafer is divided after forming the plane (P1) and the manufacturing processes of CSP are finished.

Furthermore, the manufacturing processes of a convention flip chip, such as forming a leadframe, forming a substrate, wire bonding and mounting a glass plate, are unnecessary to the chip scale package structure of the present invention. Consequently, the manufacturing cost of the present invention is effectively reduced, especially to a secondary image sensor.

Figure 2:
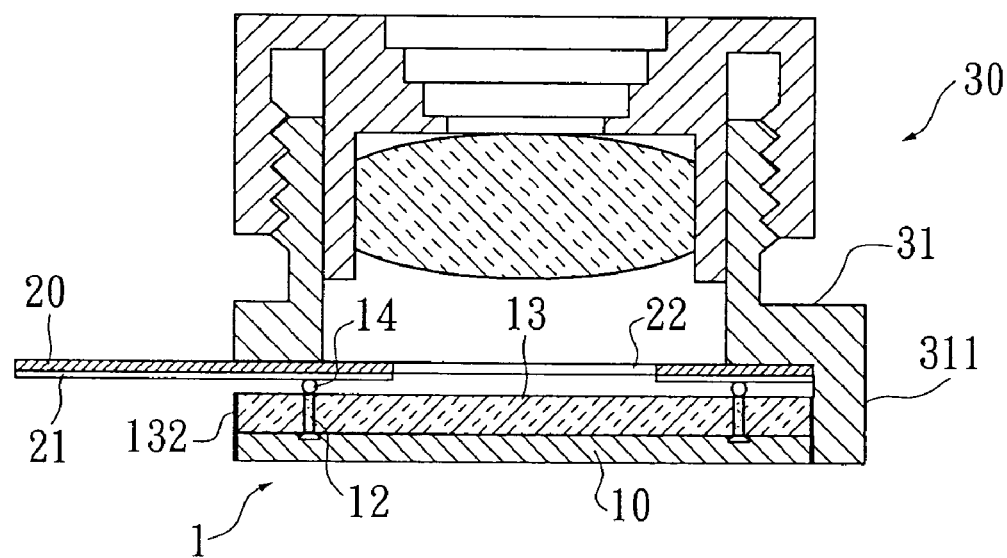
FIG. 2 is a cross-sectional schematic view of the chip scale package structure in FIG. 1 for showing the chip scale package structure used in an image sensor.
Figure 3:
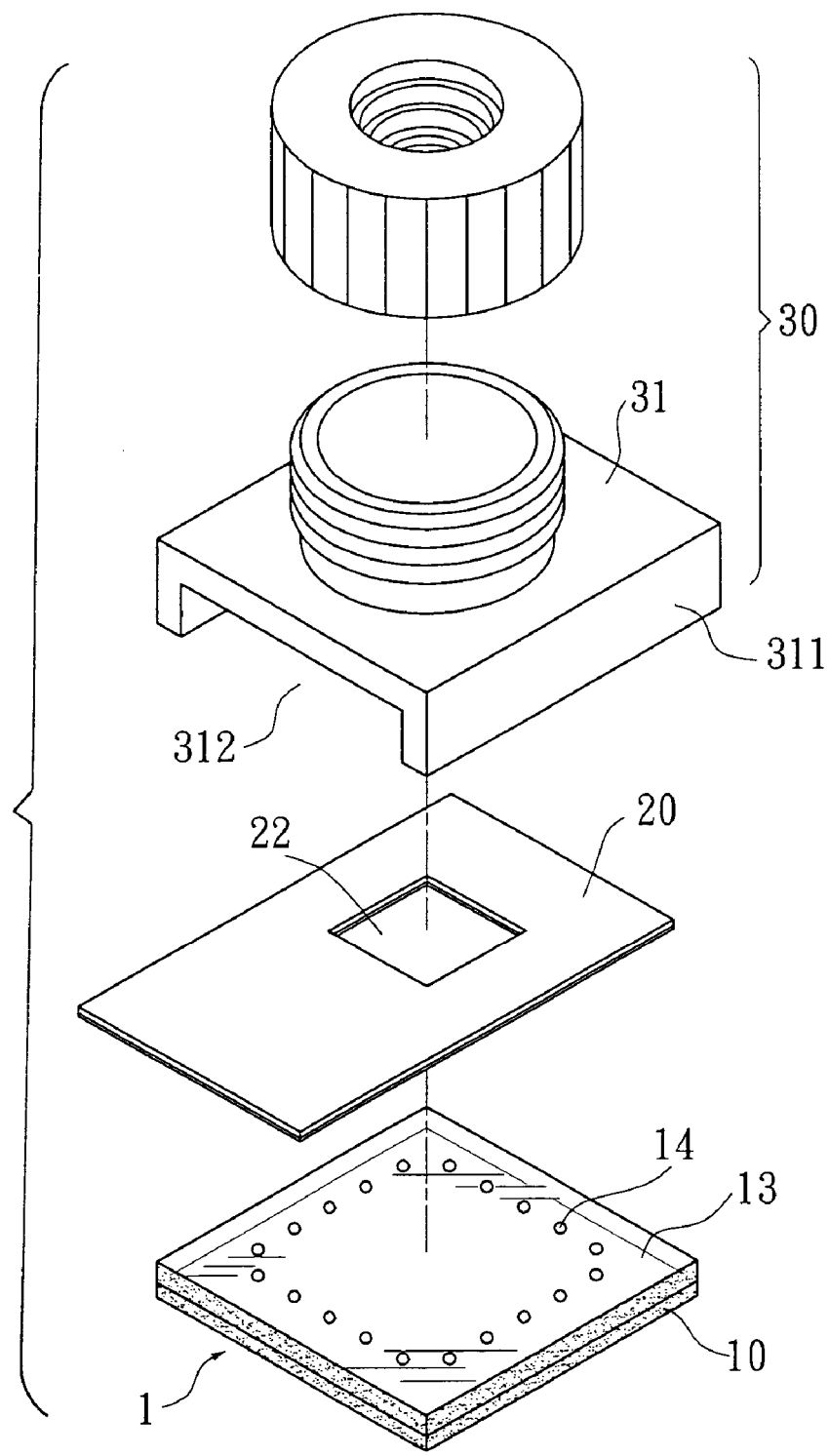
FIG. 3 is an exploded perspective view of the schematic embodiment of the chip scale package structure in FIG. 2.
Figure 4:
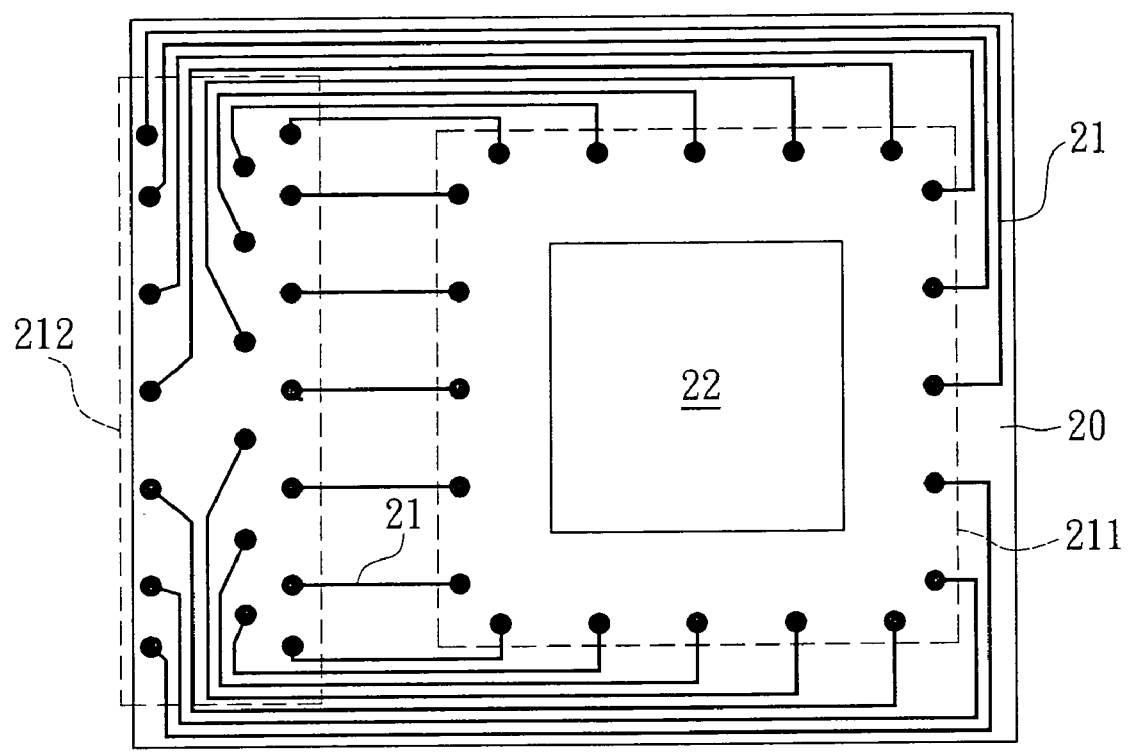
FIG. 4 is a bottom plan view of a flexible printed circuit of the chip scale package structure of the present invention.

With reference to FIGS. 2 and 3, the chip scale package structure in accordance with the present invention is provided to an image sense module. A metal solder ball (14) is planted on a free end of each of the conduct wires (12) and electrically connected to a flexible printed circuit (FPC) (20). The FPC has a window (22) defined therein and corresponding to a sensing area of the semi-conductor image sense chip (10) and a conducting circuit (21) form on a bottom face of the FPC. With reference to FIG. 4, the conducting circuit (21) includes multiple first solder points (211) formed near a periphery of the window (22). The number of the first solder points (211) corresponds to that of the conduct wire (12). The conducting circuit (21) includes multiple second solder points (212) formed near one side of the FPC (20) and arranged in an array.

The image sense module includes a lens set (30) attached to the top face of the FPC (20). The lens set (30) includes a holder (31) having a skirt (311) downward extending from the holder (31) around the semi-conductor image sense chip (10). The holder (31) includes a channel (312) defined in one side of the skirt (311) to allow the FPC (20) extending the holder (31).

The above image sense module, the plane (P1) of the transparent layer (13) can provide a good datum for the holder (31) for the light axis perpendicularly projecting to the semi-conductor image sense chip (10), and the skirt (31) can accurately position the semi-conductor image sense chip (10) for controlling the image collect area located in a lens projecting area that has a low image fault.

Figure 5:
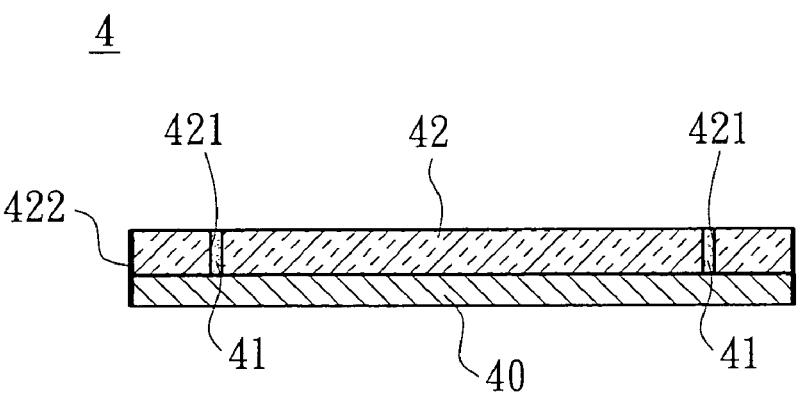
FIG. 5 is a cross-sectional view of a second embodiment of the chip scale package structure for an image sensor in accordance with the present invention.

With reference to FIG. 5 that shows a second embodiment of the CSP structure for an image sensor in accordance with the present invention, the CSP structure (4) includes a semi-conductor image sense chip (40) having multiple bumps (41) formed on a top face of the semi-conductor image sense chip (40). A transparent glass plate (42) is attached to the top face of the semi-conductor image sense chip (40). The transparent glass plate (42) has an area being equal to that of the semi-conductor image sense chip (40) and a thickness being equal to that of each of the bumps (41). The transparent glass plate (42) includes multiple penetration holes (421) defined therein. Each penetration hole (421) aligns with a corresponding one of the multiple bumps (41) such that each bump (41) extends to a top face of the transparent glass plate (42). The transparent glass plate (42) has a periphery covered by a shelter (422) to prevent the light from laterally penetrating into the chip scale package structure and influencing the quality of the images that is collected by the chip scale package structure.

Figure 6:
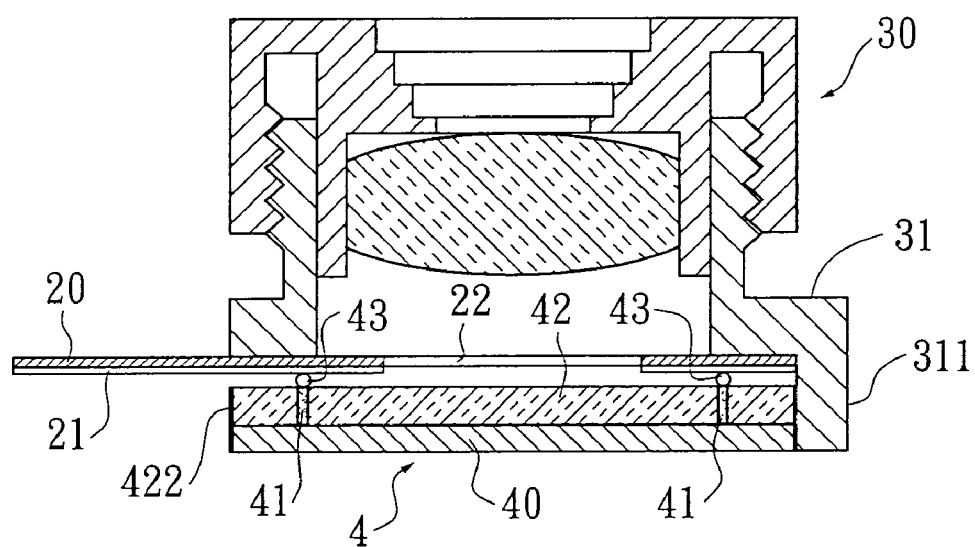
FIG. 6 is a cross-sectional schematic view of the chip scale package structure in FIG. 5 for showing the chip scale package structure used in an image sensor.
Figure 7:
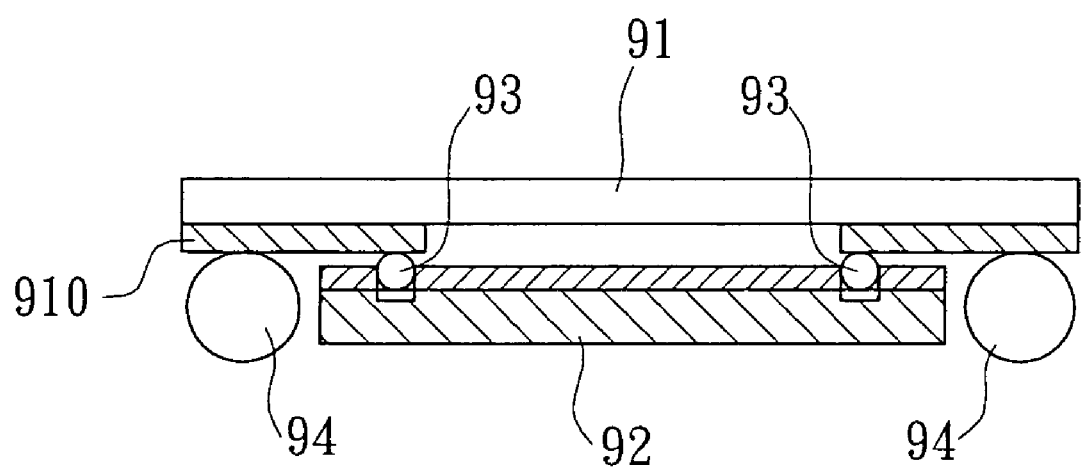
FIG. 7 is a cross-sectional view of a conventional flip chip package structure in accordance with the prior art.

With reference to FIG. 6, the CSP structure (4), as shown in FIG. 5, is provided to an image sense module. A metal solder ball (43) is planted on a free end of each of the multiple bumps (41) and electrically connected to a flexible printed circuit (FPC) (20). The FPC has a window (22) defined therein and corresponding to a sensing area of the semi-conductor image sense chip (40) and a conducting circuit (21). With reference to FIG. 4, the conducting circuit (21) includes first solder points (211) formed near a periphery of the window (22). The number of the first solder points (211) corresponds to that of the bumps (41). The conducting circuit (21) includes multiple second solder points (212) formed near one side of the FPC (20).

The image sense module includes a lens set (30) attached to the top face of the FPC (20). The lens set (30) includes a holder (31) having a skirt (311) downward extending from the holder (31) around the semi-conductor image sense chip (40). The holder (31) includes a channel (312) defined in one side of the skirt (311) to allow the FPC (20) extending the holder (31).

The transparent glass plate (42) of the second embodiment is used to replace the transparent layer (13) of the first embodiment of the present invention because the transparent layer (13) needs to be ground and burnished.

Although the invention has been explained in relation to its preferred embodiment, it is to be understood that many other possible modifications and variations can be made without departing from the spirit and scope of the invention as hereinafter claimed.

What is claimed is:

1. A chip scale package (CSP) structure for an image sensor, comprising:
   a semi-conductor image sense chip;
   multiple bonding pads formed on a top face of the semi-conductor image sense chip;
   a conducting wire extending from each of the multiple bonding pads by wire-bonding; and
   a liquefied gelatinous material covering the top face of the semi-conductor image sense chip and forming a transparent layer on the top face of the semi-conductor image sense chip after drying up, the transparent layer being a single layer structure coated over a top surface of said sense chip in a continuously contiguous manner, said transparent layer for permitting light to pass therethrough, having a thickness equal to a height of each of the conducting wire.

2. The CSP structure as claimed in claim 1, wherein the transparent layer comprises a top face ground and burnished to form a plane that is parallel to the top face of the semi-conductor image sense chip and a periphery covered by a shelter to prevent the light from laterally penetrating into the chip scale package structure and influencing the quality of the images that is collected by the chip scale package structure.

3. The CSP structure as claimed in claim 2, wherein a metal solder ball is planted on a free end of each of the conducting wires and electrically connected to a flexible printed circuit (FPC), the FPC having a window defined therein and corresponding to a sensing area of the semi-conductor image sense chip and a conducting circuit formed on a bottom face of the FPC, the conducting circuit including multiple first solder points formed near a periphery of the window and the number of the first solder points corresponding to that of the conducting wire, the conducting circuit having multiple second solder points formed near one side of the FPC.

4. The CSP structure as claimed in claim 3, wherein the second solder points of the conducting circuit are arranged in an array.

5. A chip scale package (CSP) structure for an image sensor, comprising a semi-conductor image sense chip having multiple bumps formed on a top face of the semi-conductor image sense chip and a transparent layer continuously contiguous to the top face of the semi-conductor image sense chip, the transparent layer having a thickness being equal to that of each of the bumps for permitting light to pass therethrough, the transparent layer being a transparent glass plate including multiple penetration holes defined therein, each penetration hole aligning with a corresponding one of the multiple bumps such that each bump extends to a top face of the transparent glass plate, the transparent glass plate having an area equal to that of the semi-conductor image sense chip, said transparent glass plate having a periphery covered by a shelter to prevent the light from laterally penetrating into the chip scale package structure and influencing the quality of the images collected by the chip scale package structure, wherein a metal solder ball is planted on a free end of each of the multiple bumps and electrically connected to a flexible printed circuit (FPC), the FPC having a window defined therein and corresponding to a sensing area of the semi-conductor image sense chip and a conducting circuit, the conducting circuit including multiple first solder points formed near a periphery of the window, the number of the first solder points corresponding to that of the bumps, the conducting circuit including multiple second solder points formed near one side of the FPC.

6. A chip scale package (CSP) structure for an image sensor, comprising a semi-conductor image sense chip having multiple bumps formed on a top face of the semi-conductor image sense chip and a transparent layer continuously contiguous to the top face of the semi-conductor image sense chip, the transparent layer having a thickness being equal to that of each of the bumps for permitting light to pass therethrough, said transparent layer being made from a gelatinous liquefied material covering the top face of the semi-conductor image sense chip and dried up.

7. The CSP structure as claimed in claim 6, wherein the transparent layer comprises a top face ground and burnished to form a plane that is parallel to the top face of the semi-conductor image sense chip and a periphery covered by a shelter to prevent the light from laterally penetrating into the chip scale package structure and influencing the quality of the images that is collected by the chip scale package structure.

8. The CSP structure as claimed in claim 7, wherein a metal solder ball is planted on a free end of each of the multiple bumps and is electrically connected to a flexible printed circuit (FPC), the FPC having a window defined therein and corresponding to a sensing area of the semi-conductor image sense chip and a conducting circuit, the conducting circuit including multiple first solder points formed near a periphery of the window, the number of the first solder points corresponding to that of the multiple bumps, the conducting circuit including multiple second solder points formed near a side of the FPC.

* * * * *